(12) United States Patent
Lee et al.

(10) Patent No.: US 12,022,691 B2
(45) Date of Patent: Jun. 25, 2024

(54) ORGANIC LIGHT EMITTING DISPLAY DEVICE WITH SHIELDING PATTERN CONFIGURED TO IMPROVE LIGHT TRANSMITTANCE

(71) Applicant: Samsung Display Co., Ltd., Yongin-Si (KR)

(72) Inventors: Seunghyun Lee, Asan-si (KR); Sungho Kim, Suwon-si (KR); Seokje Seong, Seongnam-si (KR); Jinsung An, Seongnam-si (KR); Minwoo Woo, Seoul (KR); Wangwoo Lee, Osan-si (KR); Hyung Joo Jun, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 453 days.

(21) Appl. No.: 17/360,081

(22) Filed: Jun. 28, 2021

(65) Prior Publication Data

US 2022/0149133 A1    May 12, 2022

(30) Foreign Application Priority Data

Nov. 6, 2020    (KR) .......................... 10-2020-0147790

(51) Int. Cl.
| | |
|---|---|
| *H10K 59/121* | (2023.01) |
| *H01L 27/12* | (2006.01) |
| *H10K 59/126* | (2023.01) |
| *H10K 59/131* | (2023.01) |

(52) U.S. Cl.
CPC ....... *H10K 59/1213* (2023.02); *H10K 59/126* (2023.02); *H10K 59/131* (2023.02); *H01L 27/1225* (2013.01); *H01L 27/1251* (2013.01)

(58) Field of Classification Search
CPC .............. H10K 10/481; H10K 10/482; H10K 59/1213; H10K 59/126; H10K 59/131; H01L 27/1225; H01L 27/1251
USPC .......................................................... 257/40
See application file for complete search history.

(56) References Cited

U.S. PATENT DOCUMENTS

| | | | |
|---|---|---|---|
| 10,074,709 B1* | 9/2018 | Tanaka | H01L 27/124 |
| 2021/0193780 A1* | 6/2021 | Diao | H01L 29/78633 |
| 2021/0265442 A1* | 8/2021 | Cho | H10K 59/1213 |
| 2021/0408192 A1* | 12/2021 | Zhang | H01L 27/1251 |
| 2022/0310754 A1* | 9/2022 | Guo | H10K 59/1216 |
| 2022/0320214 A1* | 10/2022 | Qu | H10K 59/1213 |
| 2023/0030745 A1* | 2/2023 | Sun | H01L 27/1255 |

* cited by examiner

*Primary Examiner* — Matthew E. Gordon
(74) *Attorney, Agent, or Firm* — CANTOR COLBURN LLP

(57) ABSTRACT

An organic light emitting display device includes a first transistor including a first active region and a first gate electrode disposed on the first active region, a third transistor including a third lower gate electrode disposed on the first gate electrode, a third active region disposed on the third lower gate electrode, and a third upper gate electrode disposed on the third active region, and a fourth transistor including a fourth active region disposed in the same layer as the first active region and a fourth gate electrode disposed on the fourth active region. The first transistor is a first-type transistor, and the fourth transistor is a second-type transistor different from the first-type transistor.

16 Claims, 18 Drawing Sheets

ORGANIC LIGHT EMITTING DISPLAY DEVICE WITH SHIELDING PATTERN CONFIGURED TO IMPROVE LIGHT TRANSMITTANCE

This application claims priority to Korean Patent Application No. 10-2020-0147790, filed on Nov. 6, 2020, and all the benefits accruing therefrom under 35 U.S.C. § 119, the content of which in its entirety is herein incorporated by reference.

BACKGROUND

Field

Implementations of the invention relate generally to an organic light emitting display device. More specifically, the invention relates to an organic light emitting display device having improved transmittance of external light.

Discussion of the Background

A display device used in computer monitors, TVs, and mobile phones may include an organic light emitting display ("OLEDs") that emits light by itself, and a liquid crystal display ("LCDs") that requires a separate light source.

When external light is transmitted through a first portion of the organic light emitting display device, a leakage current may be generated. Therefore, a luminance of the first portion may be deteriorated. As a result, display quality of the organic light emitting display device may be deteriorated.

On the other hand, when external light is not transmitted through a second portion of the organic light emitting display device, sensitivity of a sensor may be deteriorated. Therefore, sensor capability of the second portion may be deteriorated.

SUMMARY

Some embodiments provide an organic light emitting display device improved transmittance by providing shielding only a certain portion of the organic light emitting display device.

An organic light emitting display device according to an embodiment includes: a first transistor including a first active region and a first gate electrode disposed on the first active region; a third transistor including a third lower gate electrode disposed on the first gate electrode, a third active region disposed on the third lower gate electrode, and a third upper gate electrode disposed on the third active region; and a fourth transistor including a fourth active region disposed in the same layer as the first active region and a fourth gate electrode disposed on the fourth active region, where the first transistor is a first-type transistor, and the fourth transistor is a second-type transistor different from the first-type transistor.

According to an embodiment, the organic light emitting display device may further include a seventh transistor including a seventh active region disposed in the same layer as the first active region and a seventh gate electrode disposed on the seventh active region.

According to an embodiment, the organic light emitting display device may further include a gate initialization signal line disposed in the same layer as the first gate electrode, the fourth gate electrode, and the seventh gate electrode and which receives a gate initialization signal, where the gate initialization signal line may include the fourth gate electrode and the seventh gate electrode.

According to an embodiment, the third active region may include an oxide semiconductor.

According to an embodiment, the third transistor may be an NMOS transistor.

According to an embodiment, each of the first active region, the fourth active region, and the seventh active region may include polycrystalline silicon.

According to an embodiment, the seventh transistor may be the second-type transistor.

According to an embodiment, each of the fourth transistor and the seventh transistor may be an NMOS transistor.

According to an embodiment, the organic light emitting display device may further include: a second transistor including a second active region disposed in the same layer as the first active region and a second gate electrode disposed on the second active region; a fifth transistor including a fifth active region disposed in the same layer as the first active region and a fifth gate electrode disposed on the fifth active region; and a sixth transistor including a sixth active region disposed in the same layer as the first active region and a sixth gate electrode disposed on the sixth active region.

According to an embodiment, the third active region may include an oxide semiconductor.

According to an embodiment, the third transistor may be an NMOS transistor.

According to an embodiment, each of the first active region, the second active region, the fourth active region, the fifth active region, the sixth active region, and the seventh active region may include polycrystalline silicon.

According to an embodiment, each of the fourth transistor and the seventh transistor may be an NMOS transistor.

According to an embodiment, each of the first transistor, the second transistor, the fifth transistor, and the sixth transistor may be a PMOS transistor.

According to an embodiment, the organic light emitting display device may further include a storage capacitor including a first storage electrode connected to the first gate electrode and a second storage electrode disposed on the first storage electrode, and a boosting capacitor including a first boosting electrode connected to the second gate electrode and a second boosting electrode disposed on the first boosting electrode.

According to an embodiment, the fourth active region may include an overlap area overlapping the fourth gate electrode in a plan view, a first impurity area adjacent to the overlap area, and a second impurity area adjacent to the first impurity area, where a first impurity concentration of the first impurity area may be less than a second impurity concentration of the second impurity area.

According to an embodiment, the organic light emitting display device may further include a shielding pattern disposed on the third upper gate electrode and covering the third active region.

According to an embodiment, the shielding pattern may do not cover the fourth active region in the plan view.

According to an embodiment, the organic light emitting display device may further include a high power voltage line for transmitting a high power voltage to the first transistor, where the high power voltage line may include the shielding pattern.

The shielding pattern may be disposed on the oxide semiconductor. The shielding pattern may not be disposed on the polycrystalline silicon. The third active region of the third transistor may include the oxide semiconductor. The fourth active region of the fourth transistor may include the polycrystalline silicon. Therefore, an area in which the shielding pattern is disposed may be effectively minimized. Accordingly, the organic light emitting display device improved transmittance.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

It will be understood that when an element is referred to as being "on" another element, it can be directly on the other element or intervening elements may be present therebetween. In contrast, when an element is referred to as being "directly on" another element, there are no intervening elements present. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Illustrative, non-limiting embodiments will be more clearly understood from the following detailed description in conjunction with the accompanying drawings.

Figure 1:
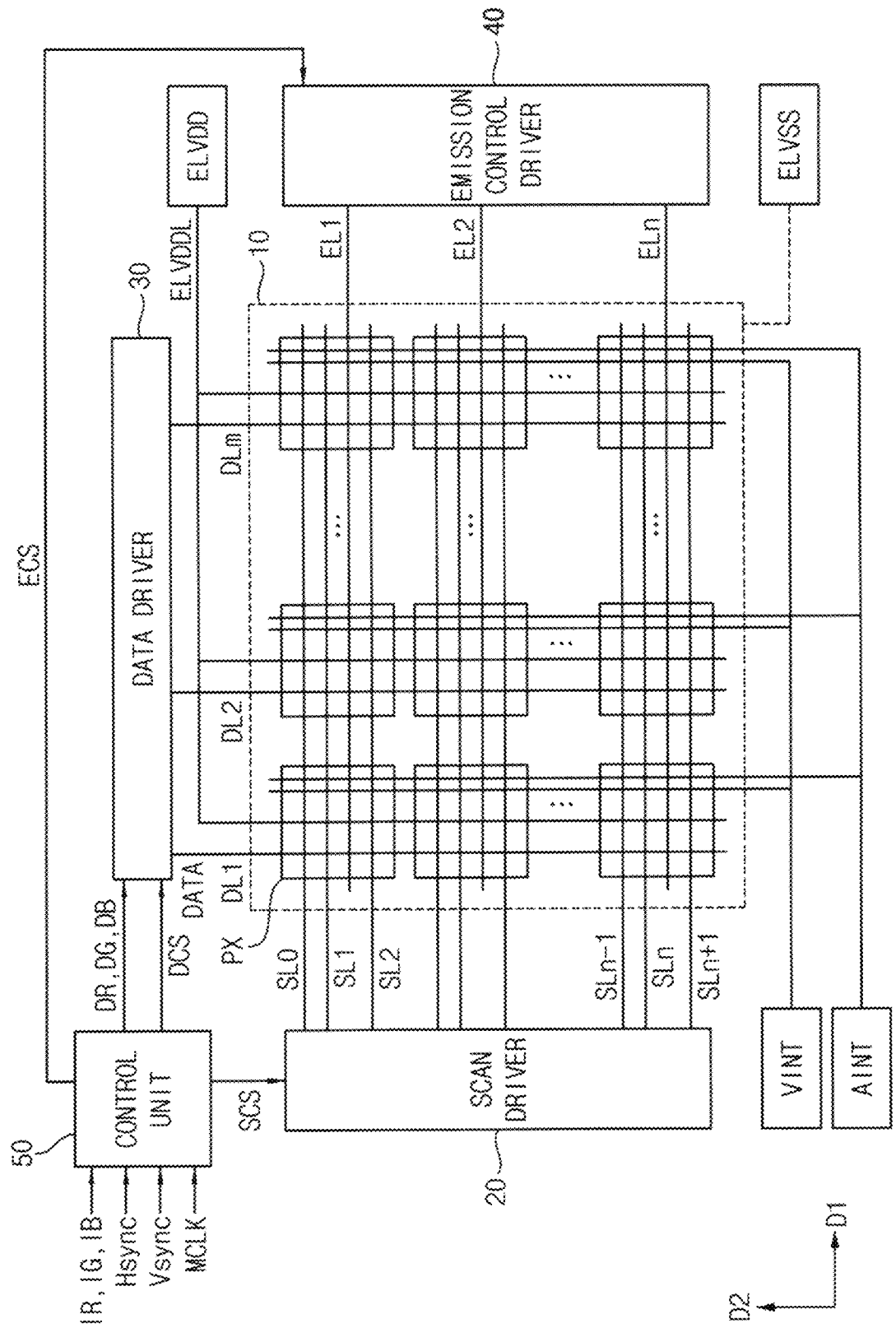
FIG. 1 is a block diagram illustrating an organic light emitting display device according to an embodiment.

FIG. 1 is a block diagram illustrating an organic light emitting display device according to an embodiment.

Referring to FIG. 1, an organic light emitting display device according to an embodiment of the invention may include a display unit 10 including a plurality of pixels, a scan driver 20, a data driver 30, an emission control driver 40, and a control unit 50.

The display unit 10 may include the plurality of pixels positioned at intersections of a plurality of scan lines SL0 to SLn+1, a plurality of data lines DL1 to DLm, and a plurality of emission control lines EL1 to ELn. Here, "n" and "m" are natural numbers. Thus, the pixels may be substantially arranged in a matrix form. The scan lines SL0 to SLn+1 and the emission control lines EL1 to ELn may be extended in a first direction D1 which is a row direction, and the data lines DL1 to DLm and a high power voltage line ELVDDL may be extended in a second direction D2 which is a column direction.

Each pixel PX may be connected to three scan lines among the scan lines SL0 to SLn+1. The scan driver 20 may transmit three scan signals to the each pixel PX through the scan lines SL0 to SLn+1. In other words, the scan driver 20 may sequentially supply scan signals to the scan lines SL1 to SLn, previous scan lines SL0 to SLn−1, and subsequent scan lines SL2 to SLn+1.

The each pixel PX may be connected to one of the data lines DL1 to DLm. The data driver 30 may transmit a data signal DATA to the each pixel PX through the data lines DL1 to DLm. The data signal DATA may be supplied to the each pixel PX selected by a scan signal when the scan signal is supplied to the scan lines SL1 to SLn.

The each pixel PX may be connected to one of the emission control lines EL1 to ELn. The emission control driver 40 may transmit an emission control signal to the each pixel PX through the emission control lines EL1 to ELn. The emission control signal may control an emission time of the each pixel PX. The emission control driver 40 may be omitted depending on an internal structure of the each pixel PX.

The control unit 50 may convert a plurality of image signals IR, IG, and D3 transmitted from the outside into a plurality of image data signals DR, DG, and DB, and may transmit the converted image data signals DR, DG, and DB to the data driver 30. In addition, the control unit 50 may receive a vertical synchronization signal Vsync, a horizontal synchronization signal Hsync, and a clock signal MCLK, and may generate control signals for controlling the scan driver 20, the data driver 30, and the emission control driver 40. In other words, the control unit 50 may transmit a scan driving control signal SCS for controlling the scan driver 20, a data driving control signal DCS for controlling the data driver 30, and an emission driving control signal ECS for controlling the emission control driver 40, respectively.

The each pixel PX may receive a high power voltage ELVDD and a low power voltage ELVSS from external power sources. The high power voltage ELVDD may be a predetermined high level voltage, and the low power voltage ELVSS may be a voltage lower than the high power voltage ELVDD or may be a ground voltage. The high power voltage ELVDD may be supplied to the each pixel PX through the high power voltage line ELVDDL. The each pixel PX may receive an initialization voltage VINT from an external power source. The each pixel PX may receive a diode initialization voltage AINT from an external power source.

The each pixel PX may emit light having a predetermined luminance by a driving current supplied to an organic light emitting diode OLED according to the transmitted data signal DATA through the data lines DL1 to DLm.

Figure 2:
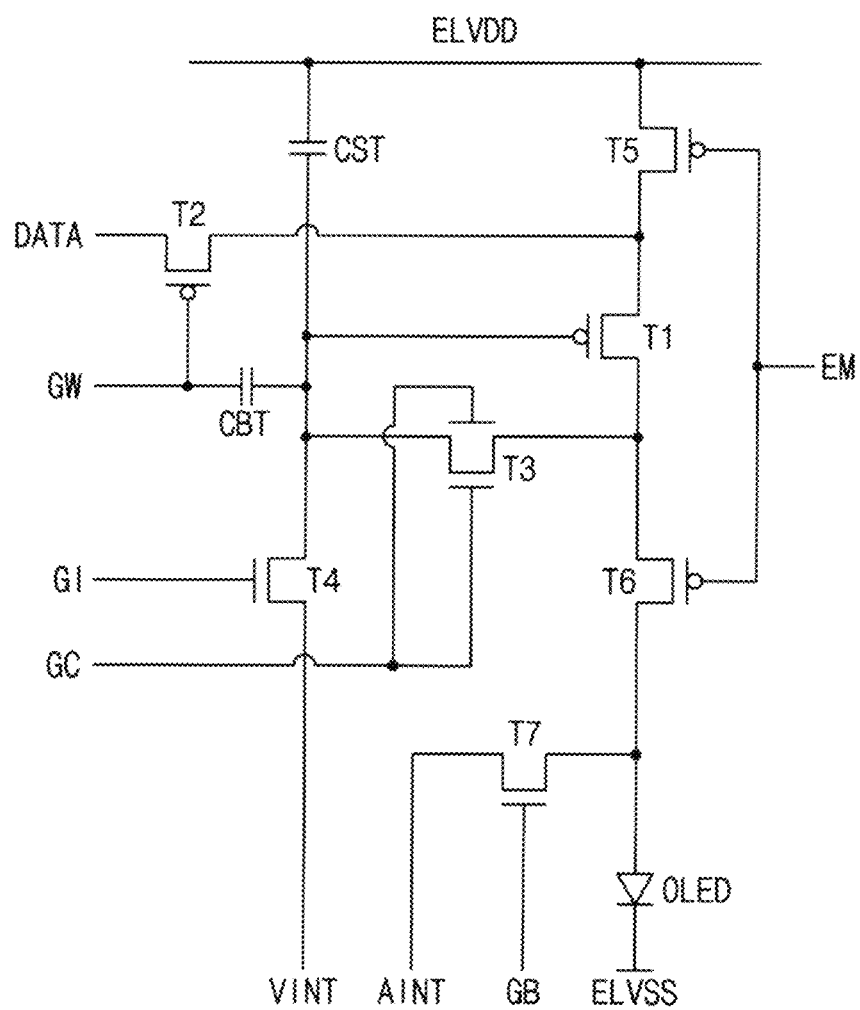
FIG. 2 is a circuit diagram illustrating a pixel according to an embodiment.

FIG. 2 is a circuit diagram illustrating a pixel according to an embodiment.

Referring to FIG. 2, the each pixel PX may include transistors T1, T2, T3, T4, T5, T6, and T7, a storage capacitor CST, a boosting capacitor CBT, and the organic light emitting diode OLED. FIG. 2 shows a case in which all of the transistors T1, T2, T3, T4, T5, T6, and T7, the storage capacitor CST, the boosting capacitor CBT, and the organic light emitting diode OLED are all provided, but the invention is not limited thereto.

A first transistor T1 may include a first terminal (e.g., a source terminal) receiving the high power voltage ELVDD, a second terminal (e.g., a drain terminal) transmitting the supplied high power voltage ELVDD to the organic light emitting diode OLED, and a gate terminal receiving a voltage for turning on or turning off the organic light emitting diode OLED. The first transistor T1 may generate a driving current based on a voltage difference between the gate terminal and the first terminal.

A second transistor T2 may include a first terminal (e.g., a source terminal) receiving the data signal DATA, a second terminal (e.g., a drain terminal) transmitting the data signal DATA to the first terminal of the first transistor T1, and a gate terminal receiving a gate signal GW. The gate signal GW may determine a turn-on state in which the data signal DATA is transmitted or a turn-off state in which the data signal DATA is not transmitted.

A third transistor T3 may include a first terminal (e.g., a source terminal) connected to the gate terminal of the first transistor T1, a second terminal (e.g., a drain terminal) connected to the second terminal of the first transistor T1, an upper gate terminal receiving a gate switching signal GC, and a lower gate terminal receiving the gate switching signal GC.

A fourth transistor T4 may include a first terminal (e.g., a source terminal) receiving the initialization voltage VINT, a second terminal (e.g., a drain terminal) connected to the first terminal of the third transistor T3, and a gate terminal receiving a gate initialization signal GI.

A fifth transistor T5 may include a first terminal (e.g., a source terminal) receiving the high power voltage ELVDD, a second terminal (e.g., a drain terminal) connected to the first terminal of the first transistor T1, and a gate terminal receiving an emission control signal EM.

A sixth transistor T6 may include a first terminal (e.g., a source terminal) connected to the second terminal of the first transistor T1, a second terminal (e.g., a drain terminal) connected to a first terminal of the organic light emitting diode OLED, and a gate terminal receiving the emission control signal EM.

A seventh transistor T7 may include a first terminal (e.g., a source terminal) connected to the second terminal of the sixth transistor T6, a second terminal (e.g., a drain terminal) connected to the external power source supplying the diode initialization voltage AINT, and a gate terminal receiving a diode initialization signal GB.

The organic light emitting diode OLED may include a first terminal (e.g., an anode terminal) connected to the second terminal of the sixth transistor T6 to receive a driving current and a second terminal (e.g., a cathode terminal) receiving the low power voltage ELVSS.

The storage capacitor CST may include a first terminal receiving the high power voltage ELVDD and a second terminal connected to the gate terminal of the first transistor T1. The storage capacitor CST may maintain a voltage level of the gate terminal of the first transistor T1 during a turn-off period of the gate signal GW.

Figure 8:
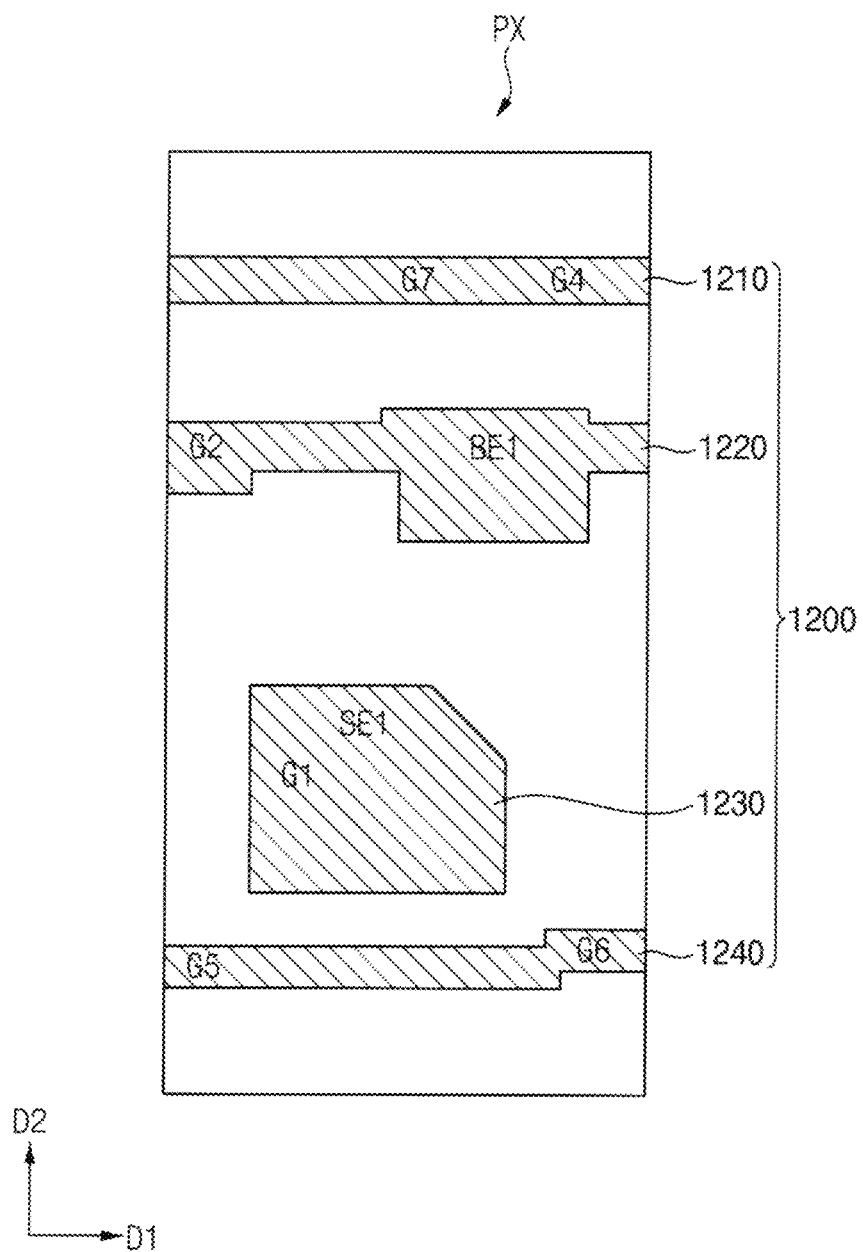
Figure 9:
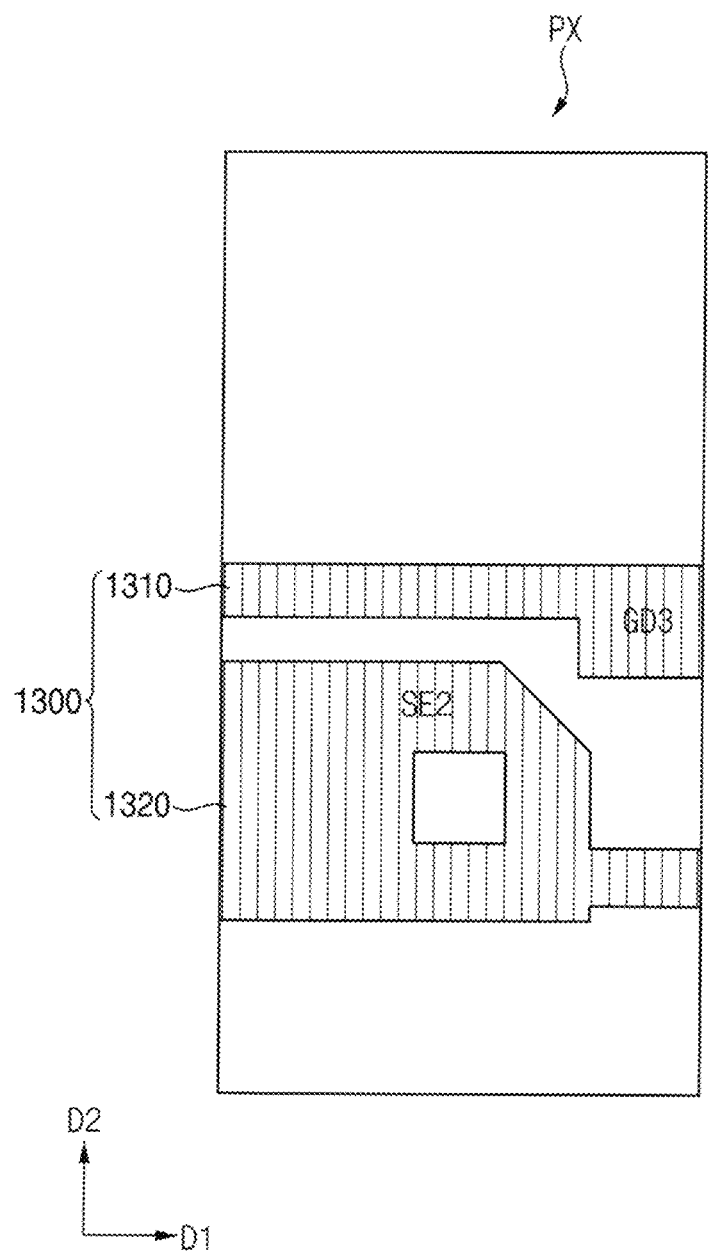
Figure 10:
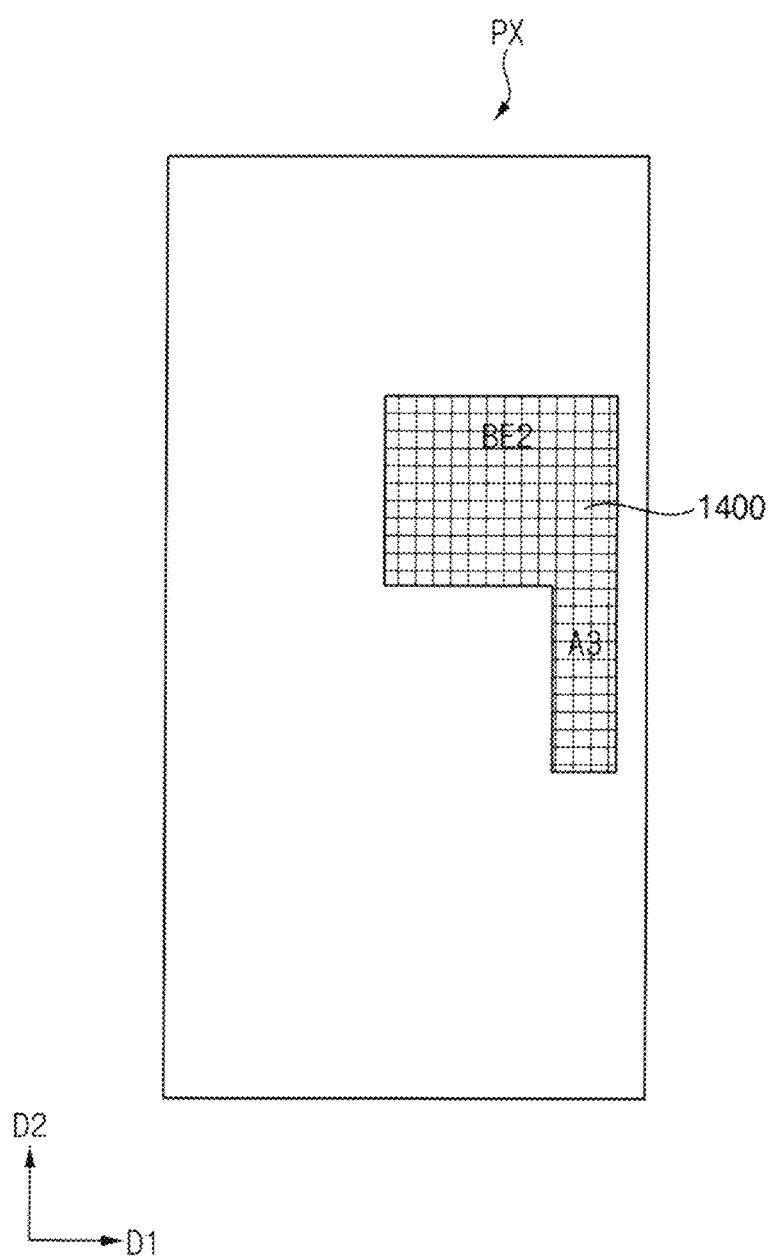
Figure 11:
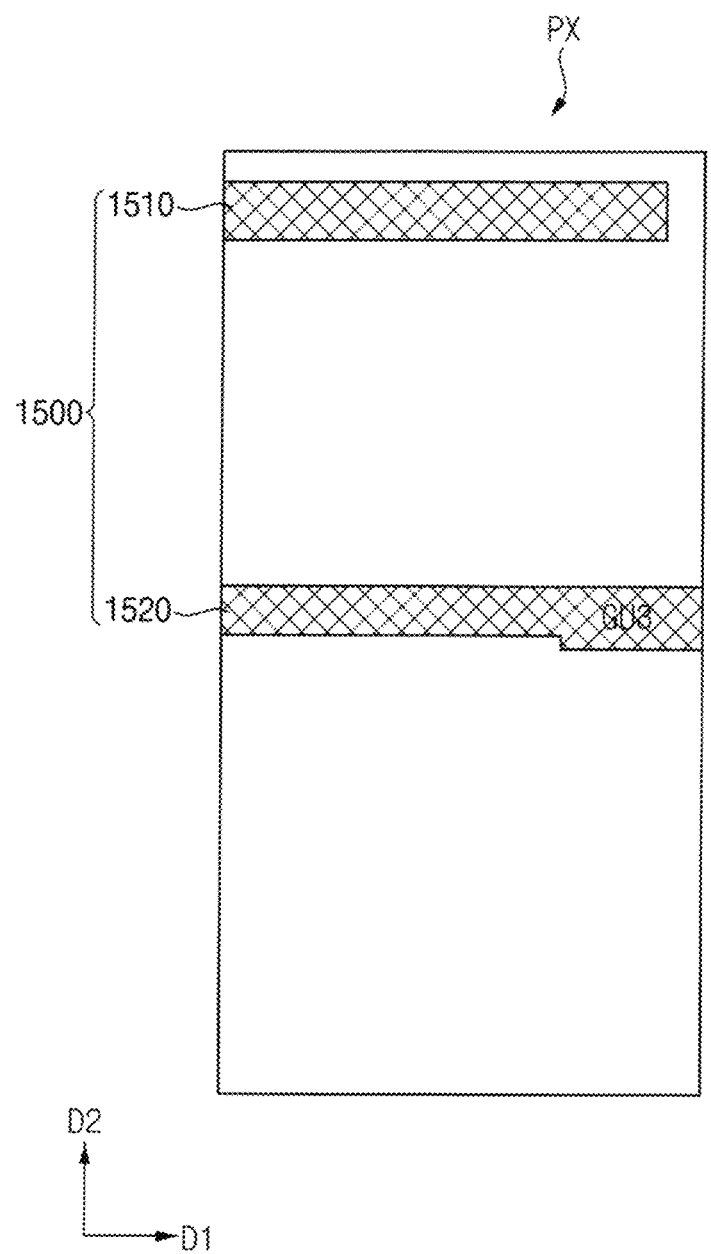
Figure 12:
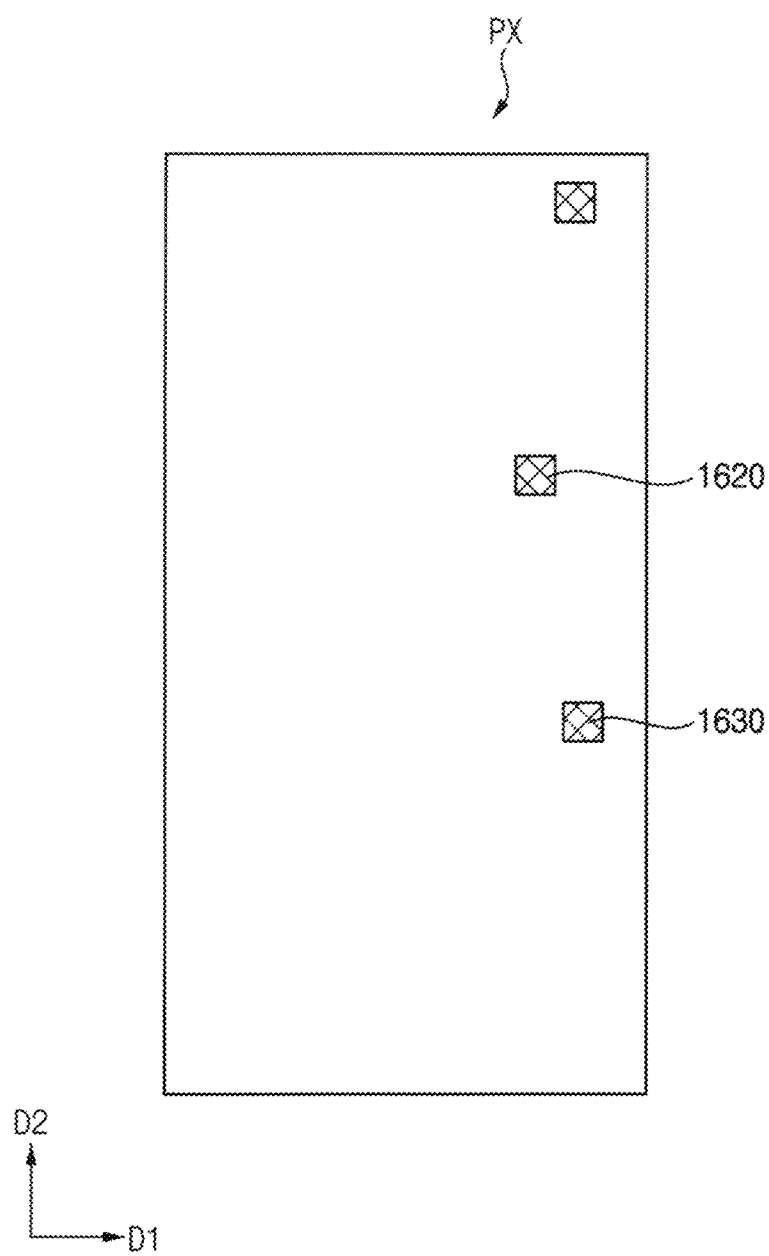
Figure 13:
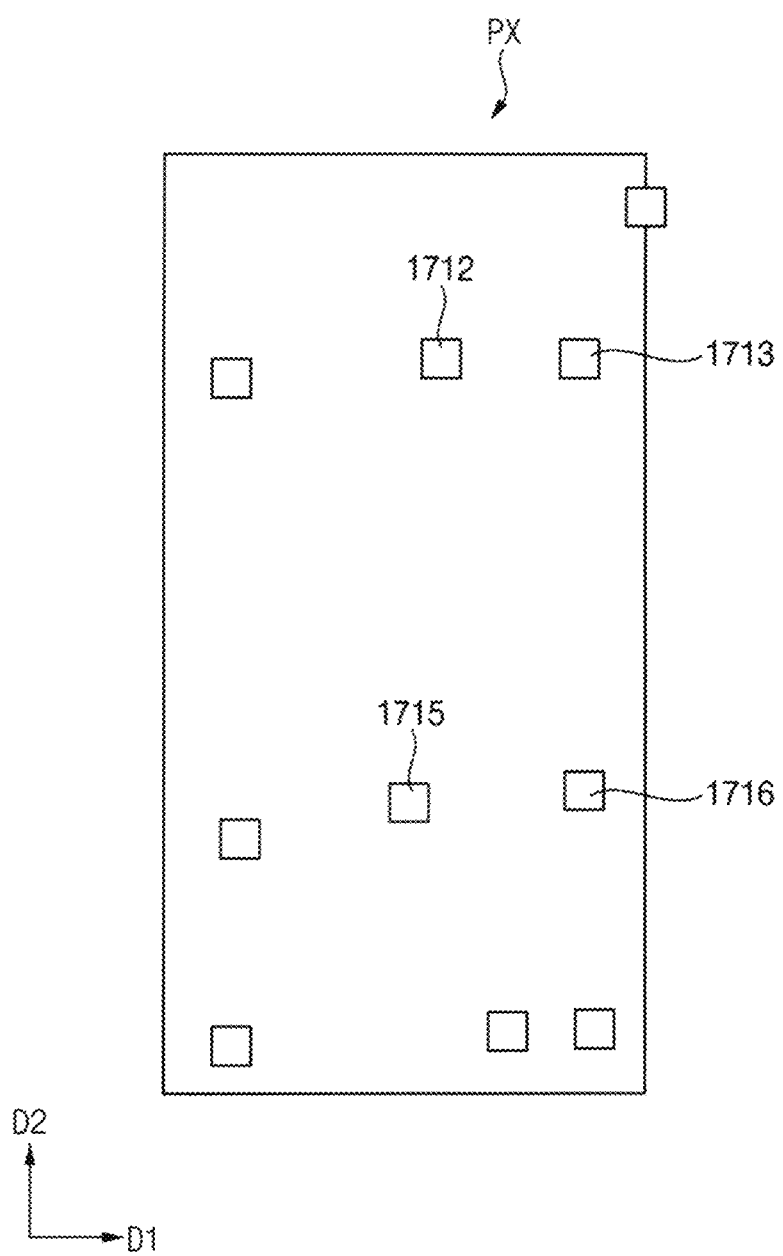
Figure 14:
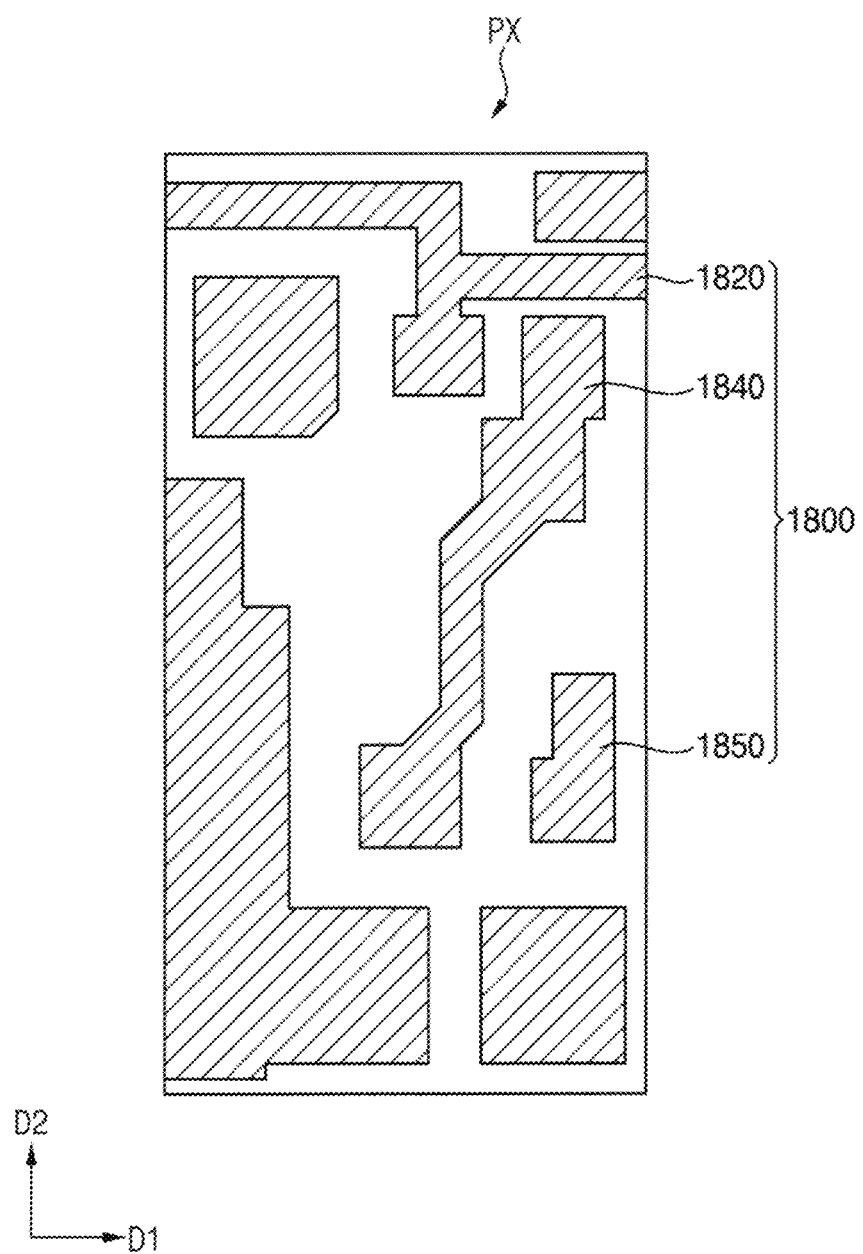
Figure 15:
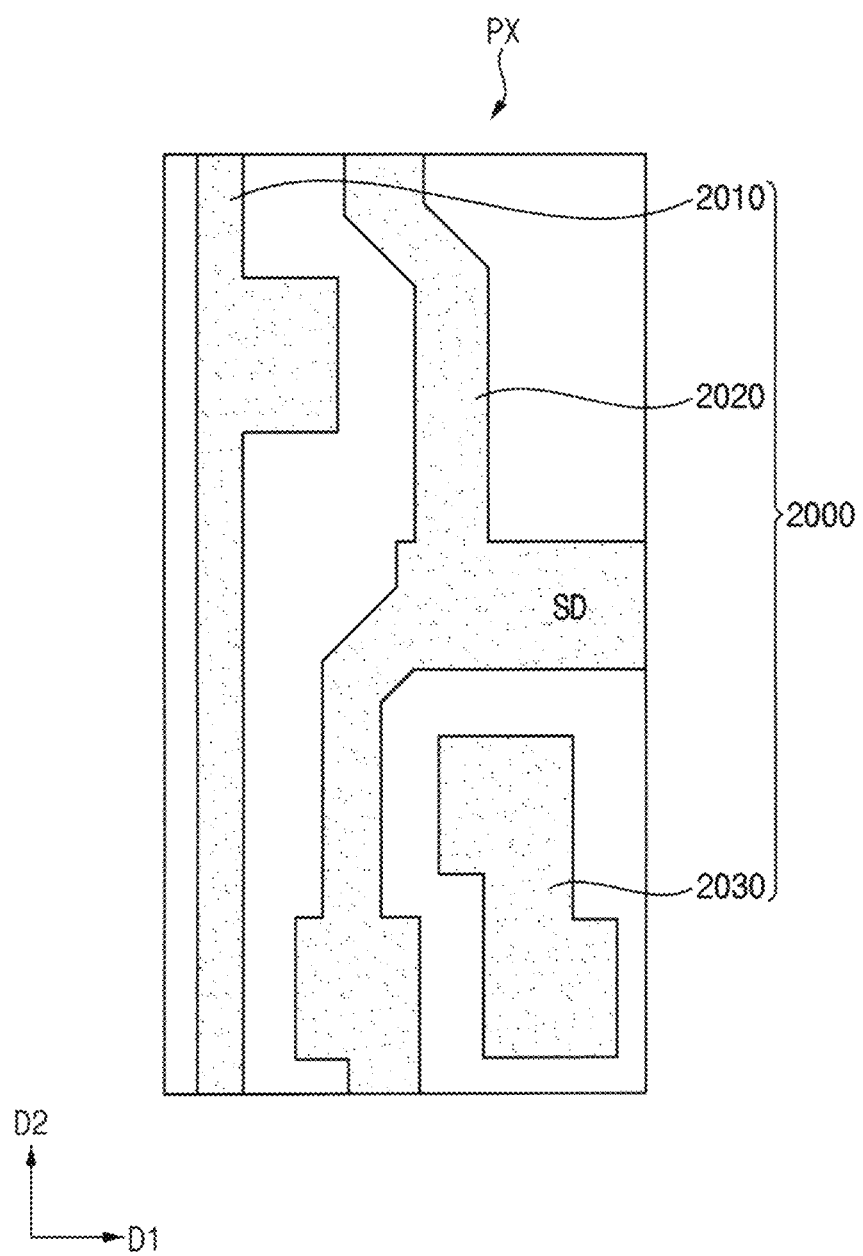

The boosting capacitor CBT may include a first terminal connected to the gate signal line 1220 (See FIG. 8) and a second terminal connected to the gate terminal of the first transistor T1. The boosting capacitor CBT may maintain a voltage level of the gate terminal of the first transistor T1 during a turn-off period of the gate initialization signal GI.

Each of the transistors T1, T2, T3, T4, T5, T6, and T7 may be an NMOS transistor or a PMOS transistor. The NMOS transistor may be turned on when a signal supplied to the gate terminal has a positive voltage level, and may be turned off when the signal supplied to the gate terminal has a negative voltage level. The PMOS transistor may be turned on when a signal supplied to the gate terminal has a negative voltage level, and may be turned off when the signal supplied to the gate terminal has a positive voltage level.

In recent years, a display device displaying a predetermined standby screen is in demand when the display device is not in use. For example, the display device supporting an Always-On Display mode has been developed. The Always-On Display mode may be a low power mode displaying the standby screen. The Always-On Display mode may display the standby screen including a time image (i.e., image indicating current time), a date image, and a weather image while the display device is in standby. The Always-On Display mode may minimize power consumption by driving at a low frequency. For example, a mode for displaying a use screen of the display device may be referred to as a high frequency driving mode and the Always-On Display mode may be referred to as a low frequency driving mode.

Figure 3:
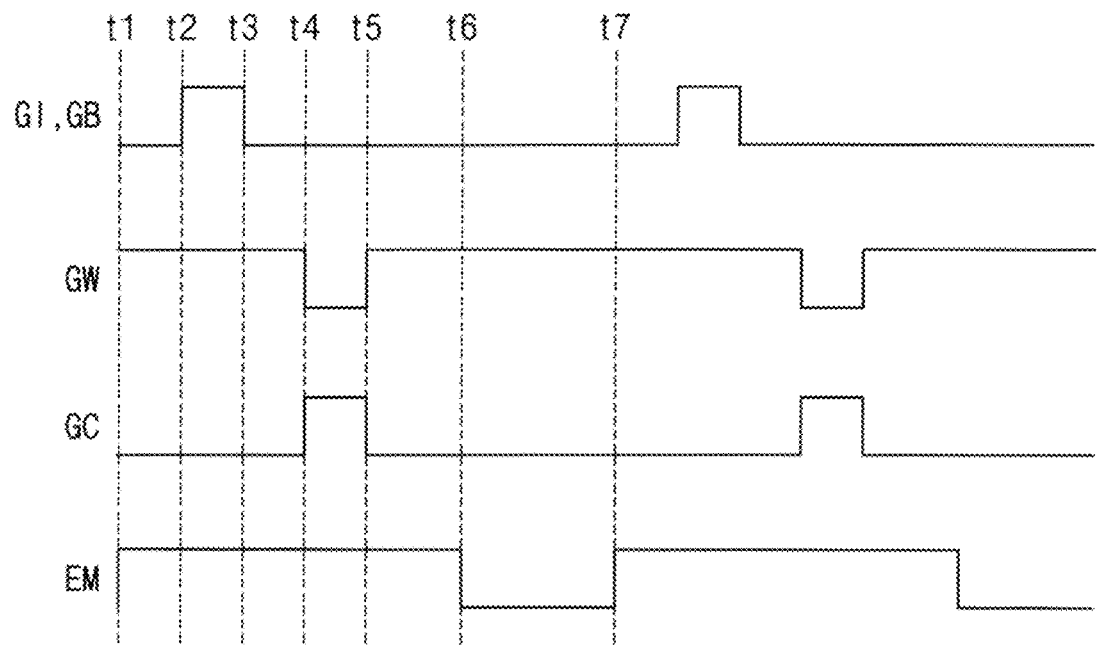
FIG. 3 is a timing diagram for driving the circuit diagram of FIG. 2 in a high frequency driving mode.

FIG. 3 is a timing diagram for driving the circuit diagram of FIG. 2 in a high frequency driving mode.

Referring to FIGS. 2 and 3, each of the first transistor T1, the second transistor T2, the fifth transistor T5, and the sixth transistor T6 may be a first-type transistor. The first-type transistor may be a PMOS transistor. Each of the third transistor T3, the fourth transistor T4, and the seventh transistor T7 may be a second-type transistor different from the first-type transistor. The second-type transistor may be an NMOS transistor. One frame may start at a first time point t1 and may end at a seventh time point t7. In the high frequency driving mode, the one frame may be continuously repeated in a next frame.

From a second time point t2 to a third time point t3, the gate initialization signal GI and the diode initialization signal GB may have a positive voltage level. Accordingly, the fourth transistor T4 and the seventh transistor T7 may be turned on. As the fourth transistor T4 is turned on, the initialization voltage VINT may be provided to the first terminal of the third transistor T3, the second terminal of the boosting capacitor CBT, the gate terminal of the first transistor T1, and the second terminal of the storage capacitor CST. As the seventh transistor T7 is turned on, a current may flow out to the external power source supplying the diode initialization voltage AINT. The current may be a remaining current after the driving current flows through the organic light emitting diode OLED to emit light. In other words, the organic light emitting diode OLED may be initialized.

From a fourth time point t4 to a fifth time point t5, the gate signal GW may have a negative voltage level and the gate switching signal GC may have a positive voltage level. Accordingly, the second transistor T2 and the third transistor T3 may be turned on. As the second transistor T2 is turned on, the data signal DATA may be provided to the first terminal of the first transistor T1. As the third transistor T3 is turned on, the initialization voltage VINT may be provided to the second terminal of the first transistor T1.

From a sixth time point t6 to a seventh time point t7, the emission control signal EM may have a negative voltage level. Accordingly, the fifth transistor T5 and the sixth transistor T6 may be turned on. As the fifth transistor T5 is turned on, the high power voltage ELVDD may be provided to the first transistor T1. Accordingly, the data signal DATA may be transmitted based on a voltage difference between the first terminal of the first transistor T1 and the second terminal of the first transistor T1. As the sixth transistor T6 is turned on, the transmitted data signal DATA may be supplied to the organic light emitting diode OLED. Accordingly, the organic light emitting diode OLED may emit light having a predetermined luminance depending on the data signal DATA.

A time taken for one frame may be controlled by a length from a third time point t3 to a fourth time point t4 and a length from a fifth time point t5 to a sixth time point t6. The next frame may be repeated in the same manner as the previous frame when the one frame is completed.

Figure 4:
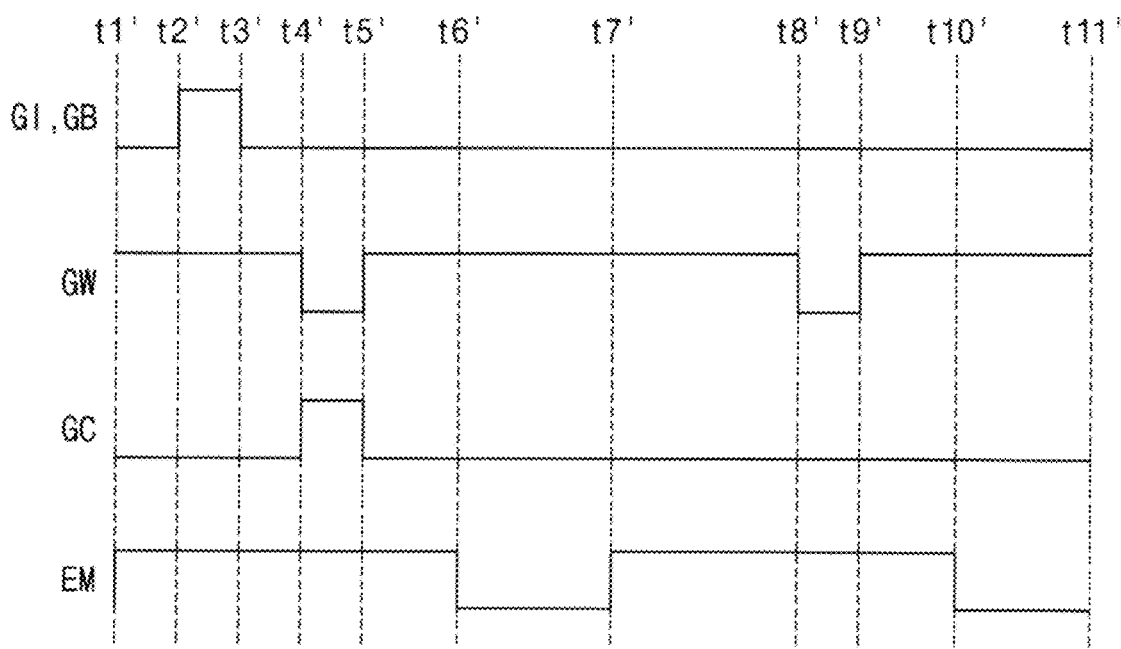
FIG. 4 is a timing diagram for driving the circuit diagram of FIG. 2 in a low frequency driving mode.

FIG. 4 is a timing diagram for driving the circuit diagram of FIG. 2 in a low frequency driving mode.

Referring to FIGS. 2, 3, and 4, one frame from the first time point t1' in the low frequency driving mode to the seventh time point t7' in the low frequency driving mode may be continued the same as one frame in the high frequency driving mode. However, a second frame in the low frequency driving mode may not be continued the first frame in the low frequency driving mode. That is, signal patterns in the second frame in the low frequency driving mode are different from signal patterns in the first frame in the low frequency driving mode.

The second frame in the low frequency driving mode may not have a time point when the gate initialization signal GI and the diode initialization signal GB have a positive voltage level. Accordingly, the fourth transistor T4 and the seventh transistor T7 may be turned off in the second frame. As the fourth transistor T4 continues to be turned off, the first terminal of the third transistor T3, the second terminal of the boosting capacitor CBT, the gate terminal of the first transistor T1, and the second terminal of the storage capacitor CST may not be received the initialization voltage VINT. As the seventh transistor T7 continues to be turned off, the remaining current may not flow out to the external power source supplying the diode initialization voltage AINT. In other words, the organic light emitting diode OLED may not be initialized.

From the eighth time point t8' in the low frequency driving mode to the ninth time point t9' in the low frequency driving mode, the gate signal GW may have a negative voltage level. On the other hand, the gate switching signal GC may still not have a positive voltage level. Accordingly, the second transistor T2 may be turned on, and the third transistor T3 may continue to be turned off. As the second transistor T2 is turned on, the data signal DATA may be provided to the first terminal of the first transistor T1. However, as the third transistor T3 is turned off, the initialization voltage VINT may not be provided to the second terminal of the first transistor T1.

From the tenth time point t10' in the low frequency driving mode to the eleventh time point t11' in the low frequency driving mode, the emission control signal EM may have a negative voltage. Accordingly, the fifth transistor T5 and the sixth transistor T6 may be turned on. As the fifth transistor T5 is turned on, the high power voltage ELVDD may be provided to the first transistor T1. Accordingly, the data signal DATA may be transmitted based on a voltage difference between the first terminal of the first transistor T1 and the second terminal of the first transistor T1. As the sixth transistor T6 is turned on, the transmitted data signal DATA may be supplied to the organic light emitting diode OLED. Accordingly, the organic light emitting diode OLED may emit light having a predetermined luminance depending on the transmitted data signal DATA. Keeping the gate initialization signal GI, the diode initialization signal GB, and the gate switching signal GC constant may be referred to as self-scan.

In the low frequency driving mode, one frame may start at a first time point t1' and may end at a seventh time point t7' and next frame may start at the seventh time point t7' may end at a eleventh time point t11'. For example, when the low frequency driving mode is driven at a 10 Hertz (Hz), a third frame to tenth frame may be repeated same as the second frame, and an eleventh frame may be repeated same as the first frame.

Figure 5:
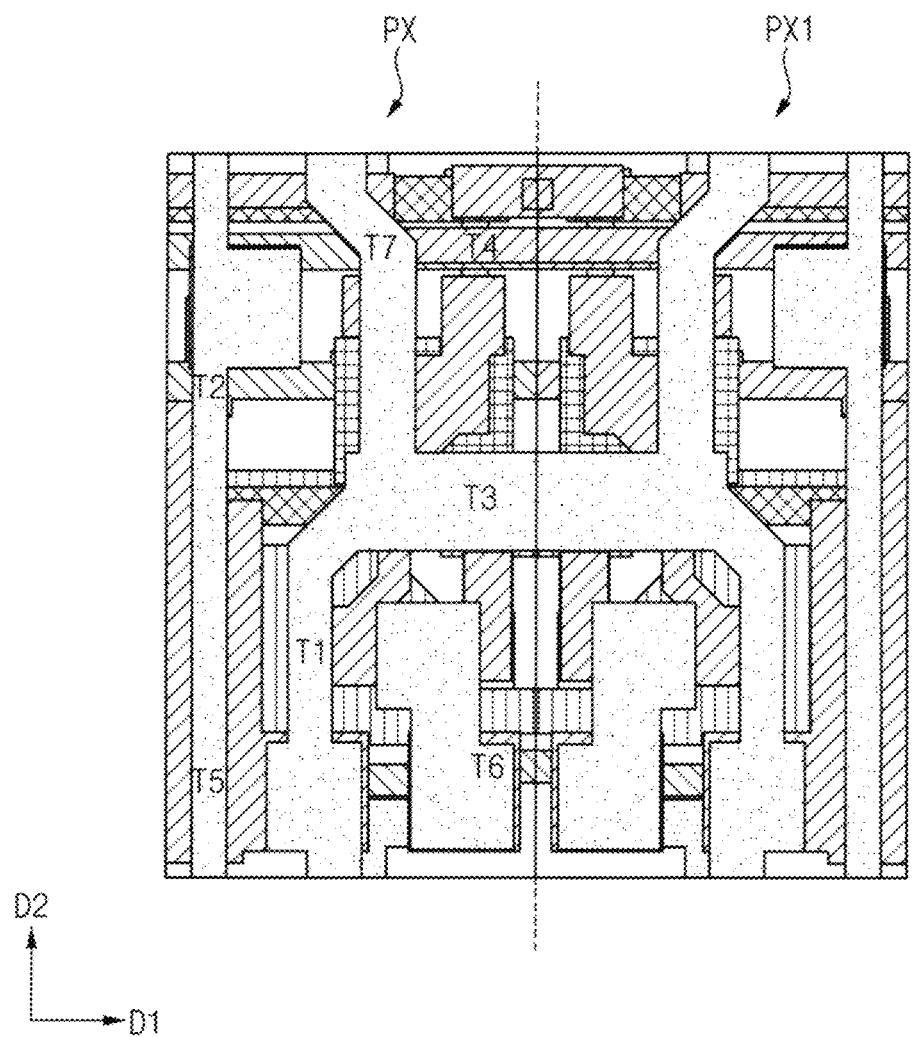
FIG. 5 is a layout view illustrating pixels adjacent to each other according to an embodiment.

FIG. 5 is a layout view illustrating pixels adjacent to each other according to an embodiment.

Referring to FIG. 5, one pixel PX and a first pixel PX1 adjacent to the pixel PX in the first direction D1 may have a symmetrical shape with respect to a vertical axis between the one pixel PX and the first pixel PX1 and extending in the second direction D2.

Figure 6:
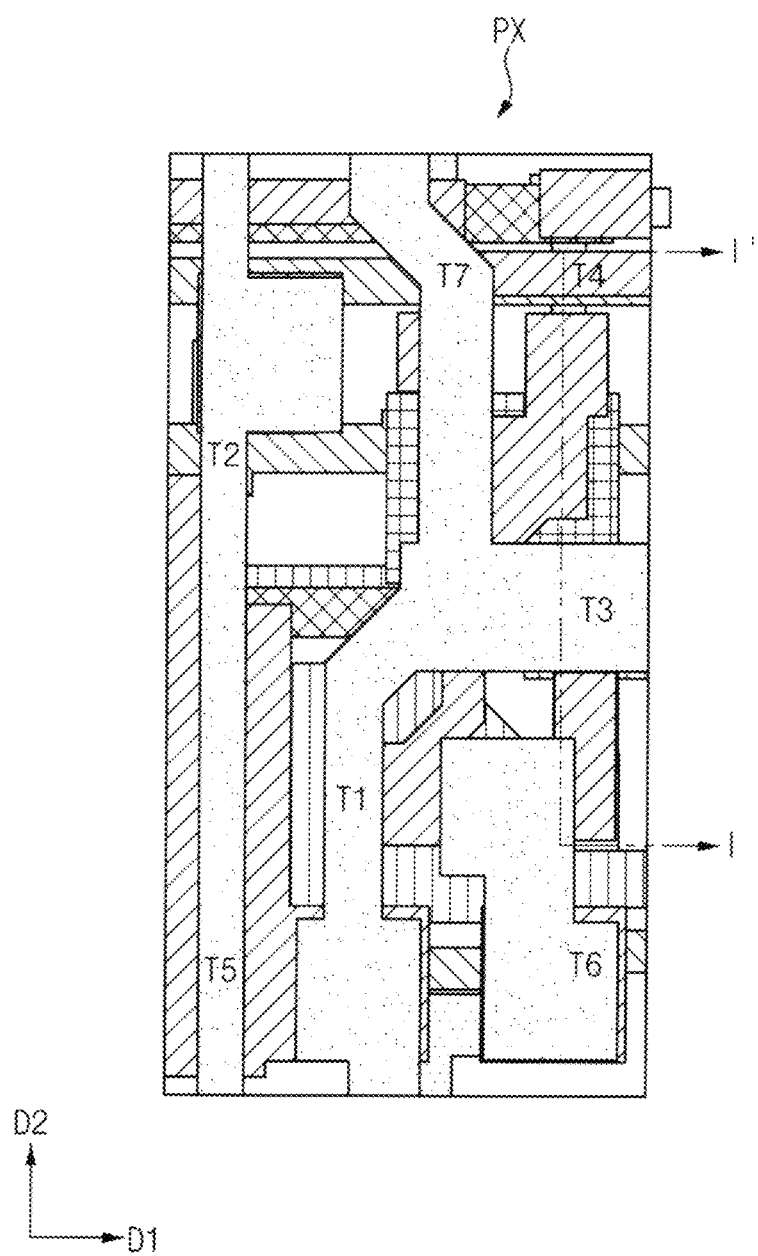
FIG. 6 is an enlarged layout view of one pixel of FIG. 5.
Figure 7:
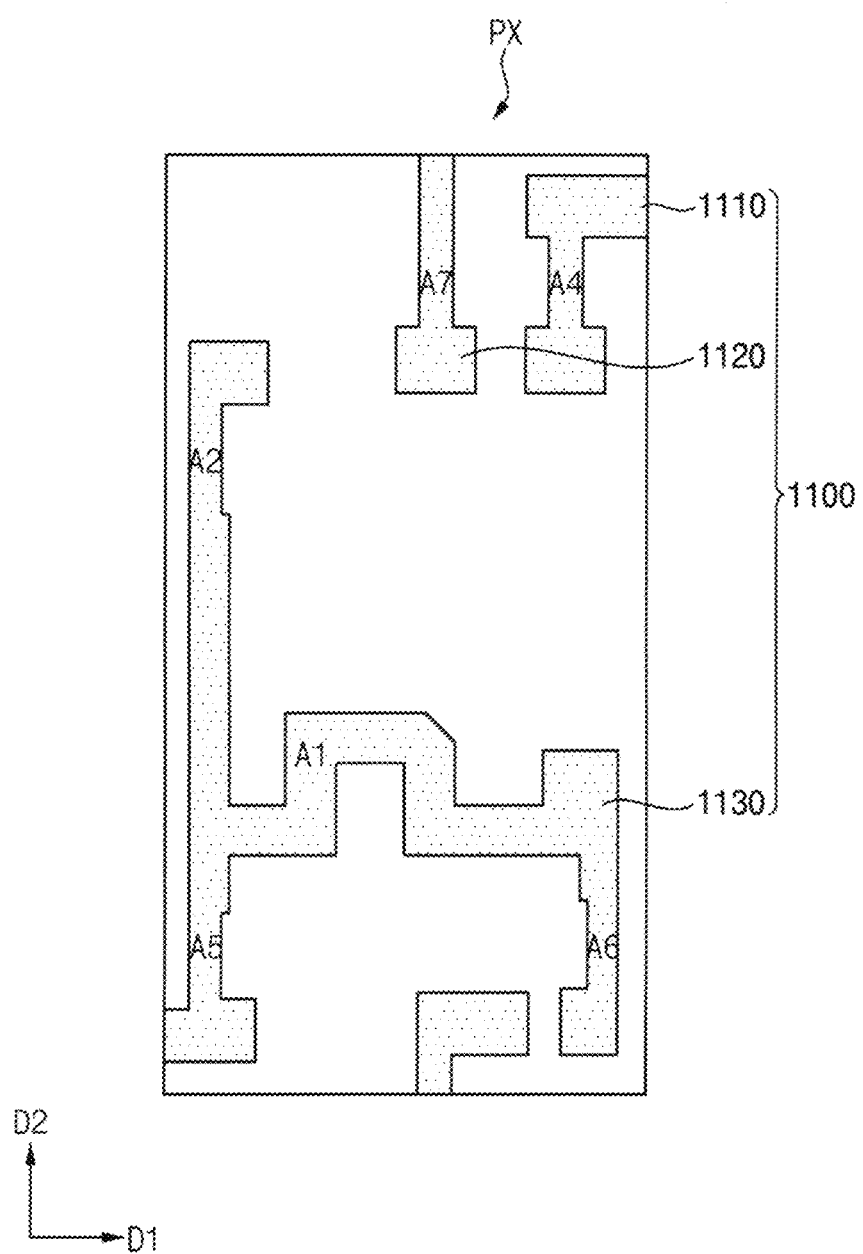
FIGS. 7 to 15 are layout views illustrating the components shown in FIG. 6 for each layer.

FIG. 6 is an enlarged layout view of one pixel of FIG. 5.

Referring to FIG. 6, the fourth transistor T4 and the seventh transistor T7 may be positioned in the same row in the first direction D1. The third transistor T3 and the sixth transistor T6 may be positioned in the same column as the fourth transistor T4 in the second direction D2. The fifth transistor T5 may be positioned in the same row as the sixth transistor T6 in the first direction D1. The second transistor T2 may be positioned in the same column as the fifth transistor T5 in the second direction D2. The first transistor T1 may be positioned between a row in which the fifth transistor T5 and the six transistor T6 are positioned and a row in which the third transistor T3 is positioned. The first transistor T1 may be positioned between a column in which the second transistor T2 and the fifth transistor T5 are positioned and a column in which the seventh transistor T7 is positioned.

Figure 16:
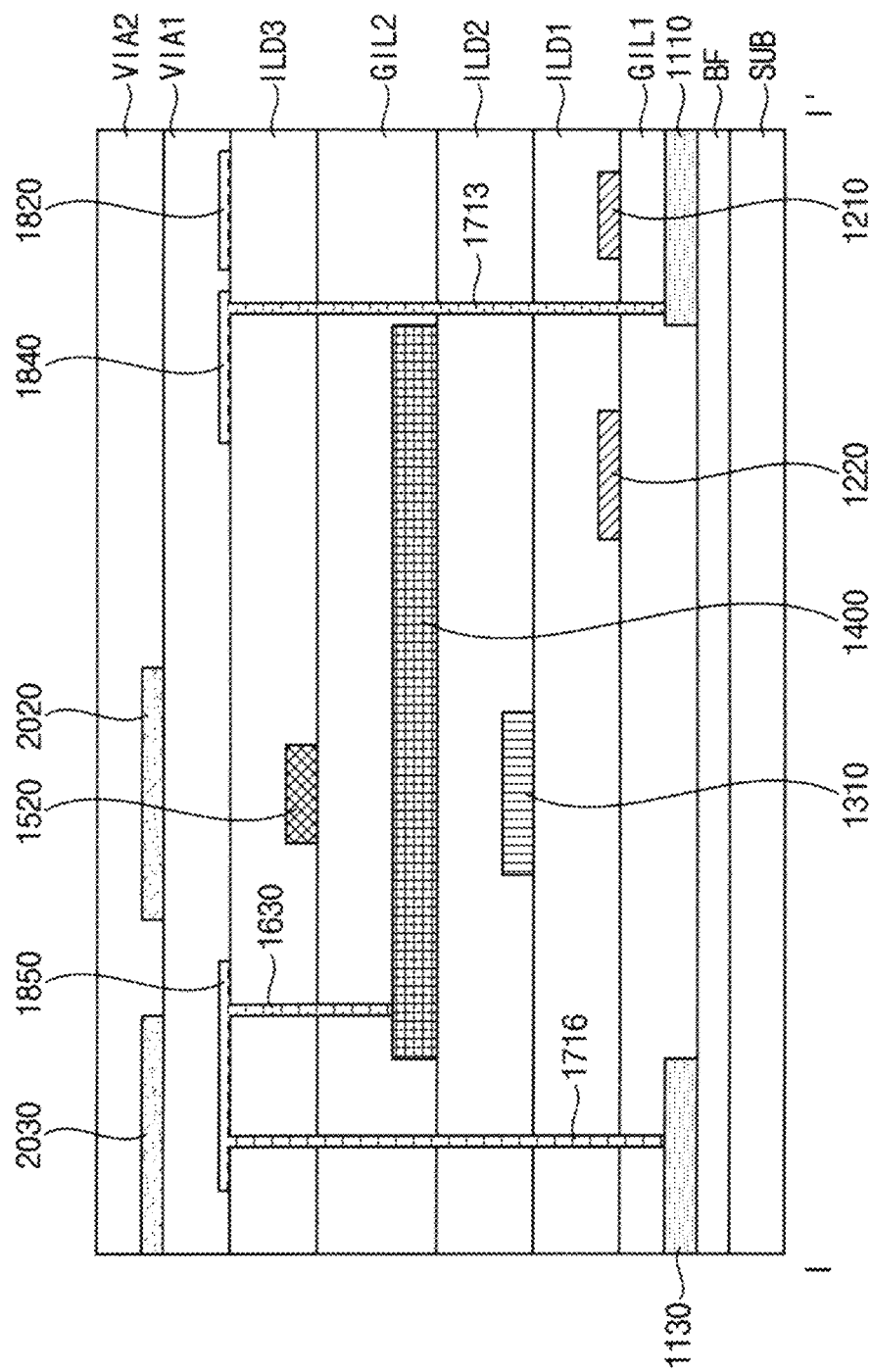
FIG. 16 is a cross-sectional view taken along line I-I' of FIG. 6.

FIGS. 7 to 15 are layout views illustrating the components shown in FIG. 6 for each layer. FIG. 16 is a cross-sectional view taken along line I-I' of FIG. 6.

Referring to FIGS. 6 to 16, the organic light emitting display device may include a substrate SUB, a buffer layer BF, a first active layer 1100, a first gate insulating layer GIL1 a first gate layer 1200, a first interlayer-insulating layer ILD1, a second gate layer 1300, a second interlayer-insulating layer ILD2, a second active layer 1400, a second gate insulating layer GIL2, a third gate layer 1500, a third interlayer-insulating layer ILD3, a first connection layer 1800, a first via-insulating layer VIA1, a second connection layer 2000, and a second via-insulating layer VIA2.

The substrate SUB may include a glass substrate, a quartz substrate, a plastic substrate, or the like. In an embodiment, the substrate SUB may include the plastic substrate, and accordingly, the organic light emitting display device may have a flexible characteristic. In this case, the substrate SUB may have a structure in which at least one organic film and at least one barrier layer are alternately stacked. For example, the organic film may include or be formed using an organic material such as polyimide, and the barrier layer may include or be formed using an inorganic material.

The buffer layer BF may be disposed on the substrate SUB. The buffer layer BF may prevent diffusion of metal atoms or impurities from the substrate SUB into the first active layer 1100. In addition, during the crystallization process for forming the first active layer 1100, the buffer layer BF may control a heat supply rate. That is, the buffer layer BF may control heat supply from the substrate SUB to the first active layer 1100. Accordingly, the first active layer 1100 may be uniformly formed.

The first active layer 1100 may be disposed on the buffer layer BF. In the first active layer 1100, a first active region A1, a second active region A2, a fourth active region A4, a fifth active region A5, a sixth active region A6, and a seventh active region A7 may be formed. The first active layer 1100 may include a first part 1110, a second part 1120, and a third part 1130. The first part 1110 may include the fourth active region A4. The second part 1120 may include the seventh active region A7. The third part 1130 may include the first active region A1, the second active region A2, the fifth active region A5, and the sixth active region A6. The first part 1110 and the second part 1120 may be spaced apart from each other in the first direction D1. The first active region A1, the second active region A2, the fifth active region A5, and the sixth active region A6 may be spaced apart from each other, but may be connected as the same third part 1130.

In an embodiment, each of the first active region A1, the second active region A2, the fifth active region A5, and the sixth active region A6 may include a silicon semiconductor. For example, the silicon semiconductor may include amorphous silicon, polycrystalline silicon, or the like. In more detail, each of the first active region A1, the second active region A2, the fifth active region A5, and the sixth active region A6 may include PMOS polycrystalline silicon.

In an embodiment, each of the fourth active region A4 and the seventh active region A7 may include a silicon semiconductor. For example, the silicon semiconductor may include amorphous silicon, polycrystalline silicon, or the like. In more detail, each of the fourth active region A4 and the seventh active region A7 may include NMOS polycrystalline silicon.

The first gate insulating layer GIL1 may be disposed on the first active layer 1100. The first gate insulating layer GIL1 may serve to insulate the first active layer 1100 from the first gate layer 1200. The first gate insulating layer GIL1 may include an insulating material. For example, the first gate insulating layer GIL1 may include silicon oxide, silicon nitride, titanium oxide, tantalum oxide, or the like.

The first gate layer 1200 may be disposed on the first gate insulating layer GIL1 In the first gate layer 1200, a first gate electrode G1, a second gate electrode G2, a fourth gate electrode G4, a fifth gate electrode G5, a sixth gate electrode G6, a seventh gate electrode G7, a first storage electrode SE1, and a first boosting electrode BE1 may be formed. The first gate layer 1200 may include a gate initialization signal line 1210, a gate signal line 1220, an isolated structure 1230, and a light emission control signal line 1240. The gate initialization signal line 1210 may include the fourth gate electrode G4 and the seventh gate electrode G7. In other words, the fourth gate electrode G4 and the seventh gate electrode G7 may be connected to each other as the gate initialization signal line 1210. The gate signal line 1220 may include the second gate electrode G2 and the first boosting electrode BE1. In other words, the second gate electrode G2 and the first boosting electrode BE1 may be connected to each other as the gate signal line 1220. The isolated structure 1230 may include the first gate electrode G1 and the first storage electrode SE1. In other words, the first gate electrode G1 and the first storage electrode SE1 may be connected to each other as the isolated structure 1230. The light emission control signal line 1240 may include the fifth gate electrode G5 and the sixth gate electrode G6. In other words, the fifth gate electrode G5 and the sixth gate electrode G6 may be connected to each other as the light emission control signal line 1240.

In an embodiment, the first gate layer 1200 may include a metal, an alloy, a conductive metal oxide, a transparent conductive material, or the like. For example, the first gate layer 1200 may include silver, alloy containing silver, molybdenum, alloy containing molybdenum, aluminum, alloy containing aluminum, aluminum nitride, tungsten, tungsten nitride, copper, nickel, chromium, chromium nitride, titanium, tantalum, platinum, scandium, indium tin oxide, indium zinc oxide, or the like.

In an embodiment, the first gate electrode G1 may receive a signal for turning on and/or turning off the first transistor T1.

In an embodiment, the second gate electrode G2 may receive the gate signal GW for turning on and/or turning off the second transistor T2 through the gate signal line 1220.

In an embodiment, the fourth gate electrode G4 may receive the gate initialization signal GI for turning on and/or turning off the fourth transistor T4 through the gate initialization signal line 1210.

In an embodiment, the fifth gate electrode G5 may receive the emission control signal EM for turning on and/or turning off the fifth transistor T5 through the light emission control signal line 1240.

In an embodiment, the sixth gate electrode G6 may receive the emission control signal EM for turning on and/or turning off the sixth transistor T6 through the light emission control signal line 1240.

In an embodiment, the seventh gate electrode G7 may receive the gate initialization signal GI for turning on and/or turning off the seventh transistor T7 through the gate initialization signal line 1210.

The first interlayer-insulating layer ILD1 may be disposed on the first gate layer 1200. The first interlayer-insulating layer ILD1 may serve to insulate the first gate layer 1200 from the second gate layer 1300. The first interlayer-insulating layer ILD1 may include an insulating material. For example, the first interlayer-insulating layer ILD1 may include silicon oxide, silicon nitride, titanium oxide, tantalum oxide, or the like.

The second gate layer 1300 may be disposed on the first interlayer-insulating layer ILD1. In the second gate layer 1300, a third lower gate electrode GD3 and a second storage electrode SE2 may be formed. The second gate layer 1300 may include a lower gate switching signal line 1310 and an overlap structure 1320. The lower gate switching signal line 1310 may include the third lower gate electrode GD3. The overlap structure 1320 may include the second storage electrode SE2.

In an embodiment, the second gate layer 1300 may include a metal, an alloy, a conductive metal oxide, a transparent conductive material, or the like. For example, the second gate layer 1300 may include silver, alloy containing silver, molybdenum, alloy containing molybdenum, aluminum, alloy containing aluminum, aluminum nitride, tungsten, tungsten nitride, copper, nickel, chromium, chromium nitride, titanium, tantalum, platinum, scandium, indium tin oxide, indium zinc oxide, or the like.

In an embodiment, the third lower gate electrode GD3 may receive the gate switching signal GC for turning on and/or turning off the third transistor T3 through the lower gate switching signal line 1310. A third upper gate electrode GU3 (to be described later in FIG. 11) may be connected to an upper gate switching signal line 1520 to receive the gate switching signal GC. If the gate switching signal GC is not provided to the third lower gate electrode GD3, impurities may deteriorate the characteristics of the third active region A3.

The second interlayer-insulating layer ILD2 may be disposed on the second gate layer 1300. The second interlayer-insulating layer ILD2 may serve to insulate the second gate layer 1300 from the second active layer 1400. The second interlayer-insulating layer ILD2 may include an insulating material. For example, the second interlayer-insulating layer ILD2 may include silicon oxide, silicon nitride, titanium oxide, tantalum oxide, or the like.

The second active layer 1400 may be disposed on the second interlayer-insulating layer ILD2. In the second active layer 1400, the third active region A3 and the second boosting electrode BE2 may be formed. The third active region A3 and the second boosting electrode BE2 may be spaced apart from each other, but may be formed in the same structure.

In an embodiment, the third active region A3 may include an oxide semiconductor. For example, the third active region A3 may include one of oxides of zinc, indium, gallium, tin, titanium, and phosphorus, or a combination thereof. Specifically, the third active region A3 may include at least one of zinc oxide, zinc-tin oxide, zinc-indium oxide, indium oxide, titanium oxide, indium-gallium-zinc oxide ("IGZO") and indium-tin-zinc oxide ("ITZO"). In more detail, the third active region A3 may include NMOS oxide semiconductor.

The second gate insulating layer GIL2 may be disposed on the second active layer 1400. The second gate insulating layer GIL2 may serve to insulate the second active layer 1400 from the third gate layer 1500. The second gate insulating layer GIL2 may include an insulating material. For example, the second gate insulating layer GIL2 may include silicon oxide, silicon nitride, titanium oxide, tantalum oxide, or the like.

The third gate layer 1500 may be disposed on the second gate insulating layer GIL2. The third gate layer 1500 may include an initialization voltage line 1510 and the upper gate switching signal line 1520. The upper gate switching signal line 1520 may include the third upper gate electrode GU3.

In an embodiment, the upper gate switching signal line 1520 may overlap the lower gate switching signal line 1310 in a plan view (i.e., view from a direction perpendicular to a plane defined by the first direction D1 and the second direction D2). Specifically, the upper gate switching signal line 1520 and the lower gate switching signal line 1310 may receive the gate switching signal GC. In other words, the upper gate switching signal line 1520 and the lower gate switching signal line 1310 may be separated from the same line. Accordingly, the third upper gate electrode GU3 and the third lower gate electrode GD3 may be connected to each other through the upper gate switching signal line 1520 and the lower gate switching signal line 1310, respectively.

In an embodiment, the initialization voltage line 1510 may be spaced apart from the upper gate switching signal line 1520 in the second direction D2 and may extend in the first direction D1. The third upper gate electrode GU3 is positioned in the upper gate switching signal line 1520. A portion of the initialization voltage line 1510 may overlap the second part 1120 of the first active layer 1100. Another portion of the initialization voltage line 1510 may overlap the first part 1110 of the first active layer 1100 in the plan view.

In an embodiment, the third gate layer 1500 may include a metal, an alloy, a conductive metal oxide, a transparent conductive material, or the like. For example, the third gate layer 1500 may include silver, alloy containing silver, molybdenum, alloy containing molybdenum, aluminum, alloy containing aluminum, aluminum nitride, tungsten, tungsten nitride, copper, nickel, chromium, chromium nitride, titanium, tantalum, platinum, scandium, indium tin oxide, indium zinc oxide, or the like.

In an embodiment, the third upper gate electrode GU3 may receive the gate switching signal GC for turning on and/or turning off the third transistor T3 through the upper gate switching signal line 1520. The third upper gate electrode GU3 and the third lower gate electrode GD3 may be connected to the upper gate switching signal line 1520 and the lower gate switching signal line 1310, respectively, to receive the gate switching signal GC. Accordingly, since the gate switching signal GC is provided to the third lower gate electrode GD3, the impurities may not deteriorate the characteristics of the third active region A3. In other words, the third transistor T3 may be referred to as including a double gate electrode corresponding to the third upper gate electrode GU3 and the third lower gate electrode GD3.

The third interlayer-insulating layer ILD3 may be disposed on the third gate layer 1500. The third interlayer-insulating layer ILD3 may serve to insulate the third gate layer 1500 from the first connection layer 1800. The third interlayer-insulating layer ILD3 may include an insulating material. For example, the third interlayer-insulating layer ILD3 may include silicon oxide, silicon nitride, titanium oxide, tantalum oxide, or the like.

A first contact hole 1630 may penetrate the third interlayer-insulating layer ILD3 and the second gate insulating layer GIL2 to expose the second active layer 1400.

A second contact hole 1716 may penetrate the third interlayer-insulating layer ILD3, the second gate insulating layer GIL2, the second interlayer-insulating layer ILD2, the first interlayer-insulating layer ILD1, and the first gate insulating layer GIL1 to expose the third part 1130 of the first active layer 1100.

A third contact hole 1713 may penetrate the third interlayer-insulating layer ILD3, the second gate insulating layer GIL2, the second interlayer-insulating layer ILD2, the first interlayer-insulating layer ILD1, and the first gate insulating layer GIL1 to expose the first part 1110 of the first active layer 1100.

A fourth contact hole 1620 may penetrate the third interlayer-insulating layer ILD3 and the second gate insulating layer GIL2 to expose the second active layer 1400.

A fifth contact hole 1715 may penetrate the third interlayer-insulating layer ILD3, the second gate insulating layer GIL2, the second interlayer-insulating layer ILD2, and the first interlayer-insulating layer ILD1 to expose the isolated structure 1230 of the first gate layer 1200.

A sixth contact hole 1712 may penetrate the third interlayer-insulating layer ILD3, the second gate insulating layer GIL2, the second interlayer-insulating layer ILD2, the first interlayer-insulating layer ILD1, and the first gate insulating layer GIL1 to expose the second part 1120 of the first active layer 1100.

The first connection layer 1800 may be disposed on the third interlayer-insulating layer ILD3. The first connection layer 1800 may include a first connection pattern 1850, a second connection pattern 1840, and a third connection pattern 1820.

In an embodiment, the first connection pattern 1850 may be disposed in the same column as the third transistor T3 and the sixth transistor T6 in the second direction D2 and may be positioned between the third transistor T3 and the sixth transistor T6. A portion of the first connection pattern 1850 may overlap the third part 1130 of the first active layer 1100 in the plan view. Another portion of the first connection pattern 1850 may overlap the second active layer 1400. The first connection pattern 1850 may fill the first contact hole 1630 and the second contact hole 1716. The first connection pattern 1850 may transmit and receive signals by electrically connecting the third part 1130 of the first active layer 1100 to the second active layer 1400.

In an embodiment, a portion of the second connection pattern 1840 may overlap the first part 1110 of the first active layer 1100 in the plan view. The second connection pattern 1840 may fill the third contact hole 1713, the fourth contact hole 1620, and the fifth contact hole 1715. Accordingly, the second connection pattern 1840 may transmit and receive signals by electrically connecting the first part 1110 of the first active layer 1100 to the third part 1130 of the first active layer 1100.

In an embodiment, a first portion of the third connection pattern 1820 may overlap the gate initialization signal line 1210, a second portion of the third connection pattern 1820 may overlap the second part 1120 of the first active layer 1100, and a third portion of the third connection pattern 1820 may overlap initialization voltage line 1510 in the plan view. The third connection pattern 1820 may fill the sixth contact hole 1712.

The first via-insulating layer VIA1 may be disposed on the first connection layer 1800. The first via-insulating layer VIA1 may serve to insulate the first connection layer 1800 from the second connection layer 2000. The first via-insulating layer VIA1 may include an organic insulating material. For example, the first via-insulating layer VIA1 may include photoresist, polyacrylic resin, polyimide resin, acrylic resin, or the like.

The second connection layer 2000 may be disposed on the first via-insulating layer VIA1. The second connection layer 2000 may include a data signal line 2010 for transmitting the data signal DATA, a high power voltage line 2020 for transmitting the high power voltage ELVDD, and a fourth connection pattern 2030.

In an embodiment, the fourth connection pattern 2030 may transmit and receive signals by electrically connecting the first connection pattern 1850 and the second connection pattern 1840.

In an embodiment, in the high power voltage line 2020, a shielding pattern SD may be disposed to cover the third upper gate electrode GU3, the third active region A3, and the third lower gate electrode GD3. The shielding pattern SD may completely overlap the third upper gate electrode GU3, the third active region A3, and the third lower gate electrode GD3 in the plan view. When the third active region A3 includes an oxide semiconductor, the shielding pattern SD may be desirable to block the transmission of external light. However, when the shielding pattern SD is disposed in a wide area of the pixel PX, the transmittance of external light may decrease. Accordingly, the sensitivity of an infrared sensor and/or a fingerprint recognition sensor of the pixel PX may decrease. Therefore, only when an active region of a transistor includes an oxide semiconductor, shielding the active region may be desirable to be disposed to overlap the active region. In other words, when the active region of the transistor includes polycrystalline silicon, shielding the active region is not required. More specifically, minimizing a shielding area is desirable. In the organic light emitting display device according to an embodiment of the invention, only the third transistor T3 is used as an oxide semiconductor, thereby minimizing the shielding area.

In an embodiment, the shielding pattern SD may not cover the fourth active region A4. In more detail, the shielding pattern SD may shield the third active region A3 and may not shield the fourth active region A4. Accordingly, the area of the shielding pattern SD is reduced, so that the transmittance of the organic light emitting display device may be improved.

The second via-insulating layer VIA2 may be disposed on the second connection layer 2000. The second via-insulating layer VIA2 may serve to insulate the second connection layer 2000 from the organic light emitting diode OLED. The second via-insulating layer VIA2 may include an organic insulating material. For example, the second via-insulating layer VIA2 may include photoresist, polyacrylic resin, polyimide resin, acrylic resin, or the like.

Figure 17:
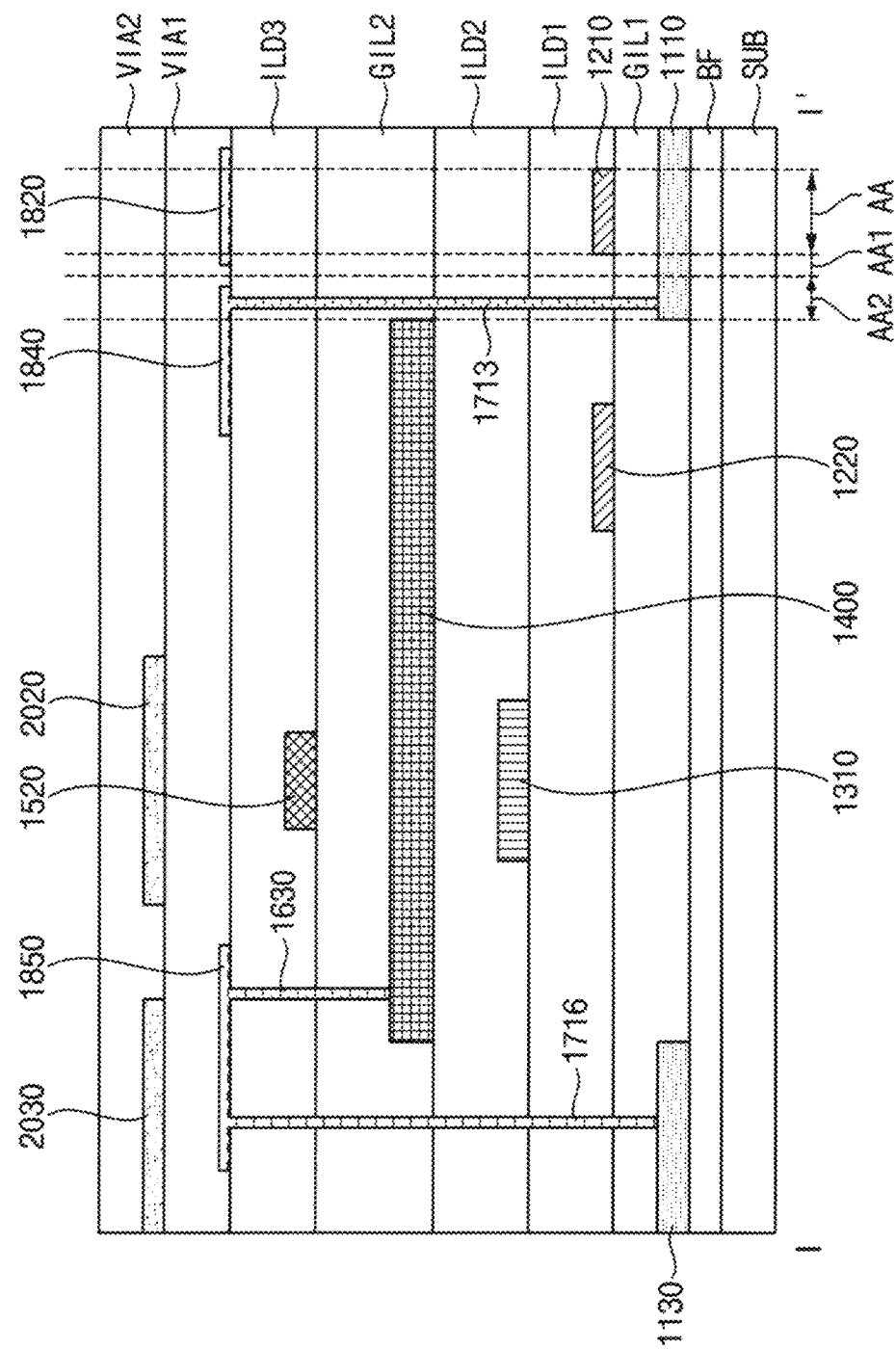
FIG. 17 is a cross-sectional view taken along line I-I' of FIG. 6 to describe impurity areas included in a fourth active region.
Figure 18:
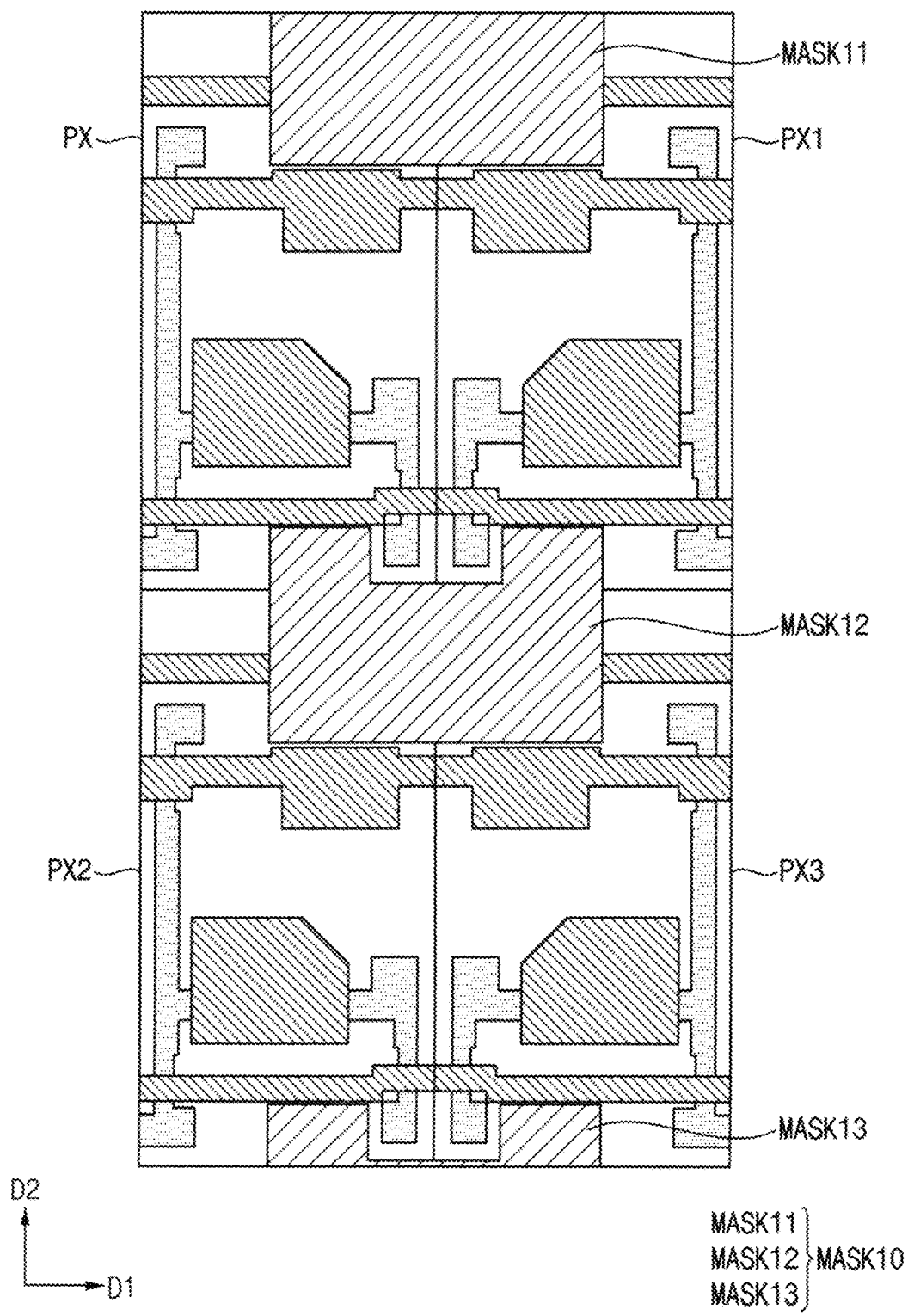
FIGS. 18 and 19 are diagrams for describing formation of impurity areas of FIG. 17.
Figure 19:
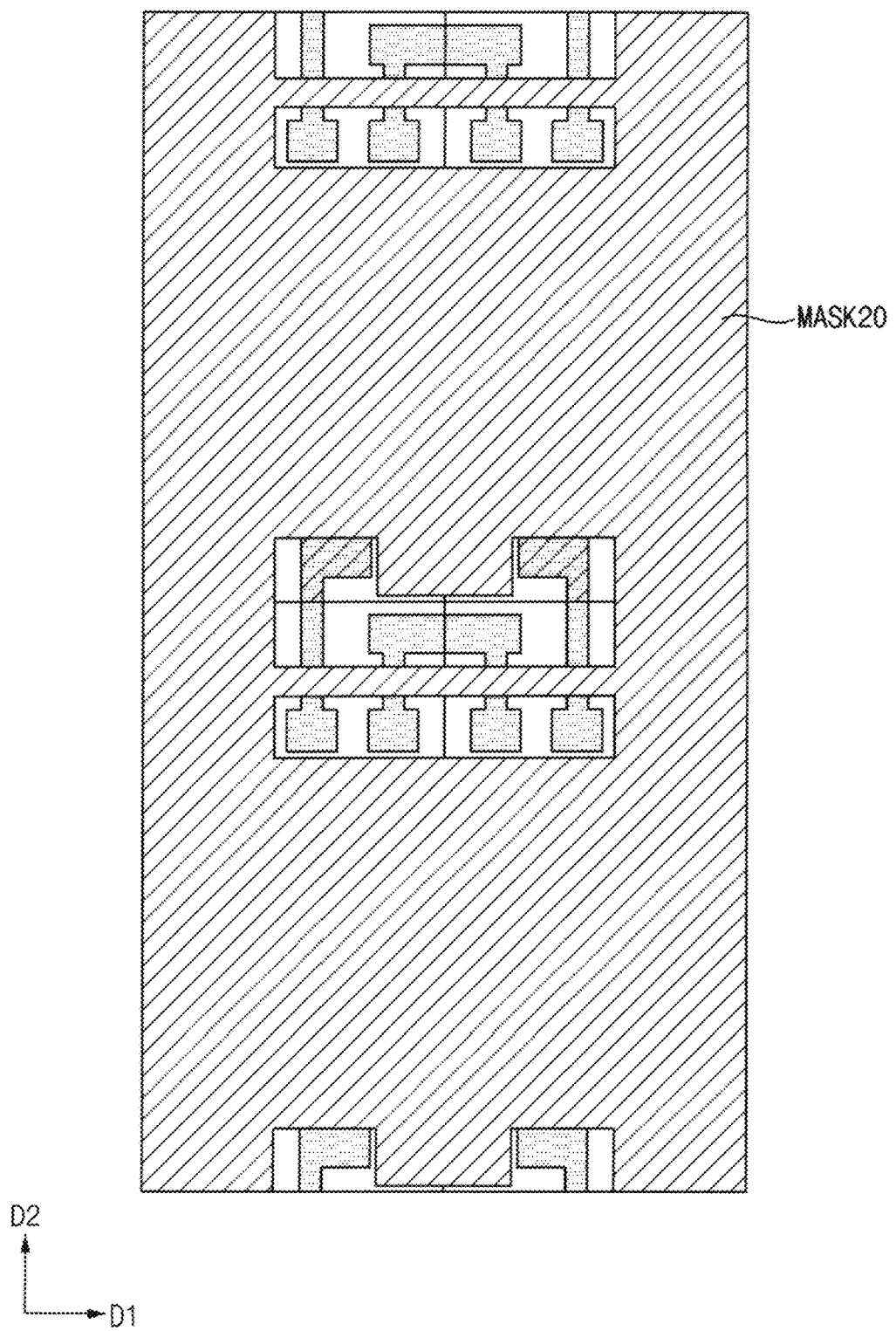

FIG. 17 is a cross-sectional view taken along line I-I' of FIG. 6 to describe impurity areas included in a fourth active region. FIGS. 18 and 19 are diagrams for describing formation of impurity areas of FIG. 17.

Referring to FIG. 17, the fourth active region A4 may include an overlap area AA, a first impurity area AA1, and a second impurity area AA2.

In an embodiment, the overlap area AA may be an area where the first part 1110 of the first active layer 1100 and the gate initialization signal line 1210 of the first gate layer 1200 overlap in the plan view. The first impurity area AA1 may be adjacent to the overlap area AA. The second impurity area AA2 may be adjacent to the first impurity area AA1. In other words, the first impurity area AA1 may be disposed between the overlap area AA and the second impurity area AA2.

Referring to FIGS. 17 to 19, the organic light emitting display device may include a first pixel PX1 adjacent to the pixel PX in a first direction D1, a second pixel PX2 adjacent to the pixel PX in a second direction D2, and a third pixel PX3 adjacent to the second pixel PX2 in the first direction D1. The first pixel PX1 is symmetrical with the pixel PX in the first direction D1. The third pixel PX3 is symmetrical with the second pixel PX2 in the first direction D1.

In an embodiment, the pixels PX, PX1, PX2, and PX3 may be in a state in which manufacturing of the first active layer 1100, the first gate insulating layer GIL1 and the first gate layer 1200 has been completed. A first mask MASK10 may cover a point where the fourth transistor T4 and the seventh transistor T7 are positioned in each of the pixels PX, PX1, PX2, and PX3. The first mask MASK10 may include sub-masks MASK11 to MASK13. In order to manufacture the organic light emitting display device, a first process of doping a first impurity into an area not covered by the first mask MASK10 may be performed. Accordingly, each of the first transistor T1, the second transistor T2, the fifth transistor T5, and the sixth transistor T6 may be a PMOS transistor.

After the first process, a second process may be performed using a second mask MASK20 covering the first gate layer 1200 and all of the area opposite to the first mask MASK10. In the second process, a second impurity may be doped in an area not covered by the second mask MASK20. By the second process, each of the fourth transistor T4 and seventh transistor T7 may be an NMOS transistor.

In the second process of doping the second impurity, an amount of a photosensitive material surrounding the gate initialization signal line 1210 of the first gate layer 1200 may be controlled. Accordingly, a concentration of the first impurity in the first impurity area AA1 and a concentration of the second impurity in the second impurity area AA2 may be controlled. The first impurity concentration of the first impurity area AA1 is less than the second impurity concentration of the second impurity area AA2. Accordingly, a first impurity concentration in the first impurity area AA1 may have a value between a high second impurity concentration in the second impurity area AA2 and a low impurity concentration in the overlap area AA. In other words, a lightly doped drain region for reducing electric field strength at a boundary between a channel region of the fourth active region A4 and a source/drain region of the fourth active region A4 may be formed.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light emitting display device comprising:
   a first transistor including a first active region and a first gate electrode disposed on the first active region;
   a third transistor including a third lower gate electrode disposed on the first gate electrode, a third active region disposed on the third lower gate electrode, and a third upper gate electrode disposed on the third active region;
   a fourth transistor including a fourth active region disposed in a same layer as the first active region and a fourth gate electrode disposed on the fourth active region, and
   a shielding pattern covering the third active region, which comprises an oxide semiconductor, but not the fourth active region, which does not comprise an oxide semiconductor,
   wherein the first transistor is a first-type transistor,
   wherein the fourth transistor is a second-type transistor different from the first-type transistor, and
   wherein the first-type transistor is a PMOS transistor, and the second-type transistor is an NMOS transistor.

2. The organic light emitting display device of claim 1, further comprising:
   a seventh transistor including a seventh active region disposed in the same layer as the first active region and a seventh gate electrode disposed on the seventh active region.

3. The organic light emitting display device of claim 2, further comprising:
   a gate initialization signal line disposed in a same layer as the first gate electrode, the fourth gate electrode, and the seventh gate electrode and which receives a gate initialization signal,
   wherein the gate initialization signal line includes the fourth gate electrode and the seventh gate electrode.

4. The organic light emitting display device of claim 2, wherein the third transistor is an NMOS transistor.

5. The organic light emitting display device of claim 2, wherein each of the first active region, the fourth active region, and the seventh active region includes polycrystalline silicon.

6. The organic light emitting display device of claim 5, wherein the seventh transistor is the second-type transistor.

7. The organic light emitting display device of claim 5, wherein the seventh transistor is an NMOS transistor.

8. The organic light emitting display device of claim 2, further comprising:
   a second transistor including a second active region disposed in the same layer as the first active region and a second gate electrode disposed on the second active region;
   a fifth transistor including a fifth active region disposed in the same layer as the first active region and a fifth gate electrode disposed on the fifth active region; and
   a sixth transistor including a sixth active region disposed in the same layer as the first active region and a sixth gate electrode disposed on the sixth active region.

9. The organic light emitting display device of claim 8, wherein the third transistor is a NMOS transistor.

10. The organic light emitting display device of claim 8, wherein each of the first active region, the second active region, the fourth active region, the fifth active region, the sixth active region, and the seventh active region includes polycrystalline silicon.

11. The organic light emitting display device of claim 10, wherein the seventh transistor is an NMOS transistor.

12. The organic light emitting display device of claim 11, wherein each of the second transistor, the fifth transistor, and the sixth transistor is a PMOS transistor.

13. The organic light emitting display device of claim 8, further comprising:
   a storage capacitor including a first storage electrode connected to the first gate electrode and a second storage electrode disposed on the first storage electrode; and
   a boosting capacitor including a first boosting electrode connected to the second gate electrode and a second boosting electrode disposed on the first boosting electrode.

14. The organic light emitting display device of claim 2, wherein the fourth active region includes an overlap area overlapping the fourth gate electrode in a plan view, a first impurity area adjacent to the overlap area, and a second impurity area adjacent to the first impurity area, wherein a first impurity concentration of the first impurity area is less than a second impurity concentration of the second impurity area.

15. The organic light emitting display device of claim 1, wherein the shielding pattern is disposed on the third upper gate electrode.

16. The organic light emitting display device of claim 15, further comprising:
a power voltage line for transmitting a power voltage to the first transistor,
wherein the power voltage line includes the shielding pattern.

* * * * *